United States Patent [19]
Ikeda

[11] Patent Number: 5,462,899
[45] Date of Patent: Oct. 31, 1995

[54] CHEMICAL VAPOR DEPOSITION METHOD FOR FORMING SIO₂

[75] Inventor: Yasuo Ikeda, Tokyo, Japan

[73] Assignee: NEC Corporation, Tokyo, Japan

[21] Appl. No.: 159,235

[22] Filed: Nov. 30, 1993

[30] Foreign Application Priority Data

Nov. 30, 1992 [JP] Japan .................................. 4-320974

[51] Int. Cl.⁶ ............................ H01L 21/31; B05D 1/26; B05D 5/12; B05D 7/14
[52] U.S. Cl. ........................ 437/238; 427/561; 427/563; 427/568; 427/585
[58] Field of Search .................. 427/561, 563, 427/568, 579, 585; 437/238

[56] References Cited

U.S. PATENT DOCUMENTS

| | | | |
|---|---|---|---|
| 3,306,768 | 2/1967 | Peterson | 437/238 |
| 4,818,560 | 4/1989 | Ishihara et al. | 427/38 |
| 4,835,005 | 5/1989 | Hirooka et al. | 427/38 |
| 4,845,054 | 7/1989 | Mitchener | 437/238 |
| 5,360,646 | 11/1994 | Morita | 427/574 |

FOREIGN PATENT DOCUMENTS

1-221431 9/1989 Japan .......................... C08G 77/50

OTHER PUBLICATIONS

Weast, Robert C., "CRC Handbook of Chemistry & Physics" 58th Ed., 1977–78, CRC Press Inc., p. D74.
H. Kotani et al., "Low–Temperature APCVD Oxide Using TEOS–Ozone Chemistry for Multilevel Interconnections", IEDM–89 (1980), pp. 669–672.
K. Fujino et al., "Doped Silicon Oxide Deposition by . . . Using Tetraethoxysilane and Ozone", Journal of Electrochemical Society, vol. 138, No. 10, Oct. 1991, pp. 3019–3024.
Y. Ikeda et al., "Ozone/Organic–Source APCVD for Conformal Doped Oxide Films", Journal of Electronic Materials, vol. 19, No. 1 (1990), pp. 45–49.
Y. Ikeda et al., "Oxide Film Formation using O₃/Organic–Source APCVD", Denkikagaku, vol. 56, No. 7 (1988), pp. 527–532.

*Primary Examiner*—R. Bruce Brenenman
*Assistant Examiner*—Matthew Whipple
*Attorney, Agent, or Firm*—Sughrue, Mion, Zinn, Macpeak & Seas

[57] ABSTRACT

A silicon oxide film is deposited on a substrate by chemical vapor deposition (CVD) using an organosilicon compound such as tetraethylorthosilicate (TEOS) and ozone as the principal reactants. The organosilicon compound gas and an ozone-oxygen gas which is relatively low in ozone concentration such as 0.1–1% are mixed in a gas mixer outside the CVD reaction chamber, and the resultant gas mixture is fed into the reaction chamber. Separately, another ozone-oxygen gas which is relatively high in ozone concentration such as 1–10% is introduced directly into the reaction chamber so as to come into contact with and mix with the aforementioned gas mixture in the vicinity of the substrate surface. The obtained silicon oxide film is good in film properties and step coverage, and the CVD operation does not suffer from deposition of reaction products in the gas feeding pipes and gas injecting nozzles.

9 Claims, 7 Drawing Sheets

$$D = \left(1 - \frac{d_{min}}{d_0}\right) \times 100(\%)$$

CHEMICAL VAPOR DEPOSITION METHOD FOR FORMING SIO₂

BACKGROUND OF THE INVENTION

This invention relates to an improved method of forming a film on a substrate surface by chemical vapor deposition (CVD) using at least two kinds of reactant gases, such as an organosilicon compound gas and oxygen gas containing ozone in the case of depositing a silicon oxide film.

In the fabrication of semiconductor devices, CVD is widely employed for depositing a silicon oxide film on a substrate surface. With a view to depositing silicon oxide films of good properties at fairly high deposition rates at relatively low temperatures, recently attention has been devoted to the use of tetraethylorthosilicate (abbreviated to TEOS) $Si(OC_2H_5)_4$ or an alternative organosilicon compound and ozone as the principal reactants to carry out CVD.

The deposition of a silicon oxide film by reaction between TEOS gas and ozone, as an oxygen gas containing ozone, can be accomplished by atmospheric pressure CVD. Known atmospheric pressure CVD methods using TEOS and ozone are classified broadly into two categories, viz. premix methods shown, e.g., in IEDM-89 (1989), pp. 669–672 and Journal of Electrochemical Society, Vol. 138, No. 10(1991), pp. 3019–3024 and post-mix methods shown, e.g., in Denkikagaku, Vol. 56, No. 7(1988), pp. 527–532 and Journal of Electronic Materials, Vol. 19, No. 1 (1990), pp. 45–49.

In the premix method, TEOS gas and an ozone-oxygen gas are mixed in a gas mixer which is provided outside the CVD reaction chamber and kept heated, and the resultant gas mixture is fed into the reaction chamber through a suitably heated pipe. By this method TEOS makes contact with ozone for a relatively long period of time, and TEOS begins to react with ozone within the gas mixer or the piping connecting the mixer to the reaction chamber. Therefore, oxidation of TEOS proceeds almost to the full extent, and this is effective for depositing a silicon oxide film with very good in film properties and low in moisture content. Furthermore, when the substrate surface has steps such as aluminum wiring lines, the film deposited by the premix method is fairly good in conformality to the steps. This is probably attributed to the formation of intermediate reaction products in the gas mixture of TEOS and ozone before the gas mixture approaches the substrate surface.

However, the premix method has disadvantages which are also attributed to the early commencement of reaction between TEOS and ozone. That is, as the CVD operation is repeated solid oxides formed by the reaction deposit and accumulate in the piping through which the TEOS and ozone mixture is fed and gas injection nozzles in the reaction chamber. Consequently the piping and the nozzles deteriorate, and changes occur in the rate of film deposition on the substrate surface and the properties of the deposited film. Besides, adhesion of contaminating particles to the deposited film increases. These problems become very serious when the ozone concentration in the ozone-oxygen gas is relatively high.

In the post-mix methods TEOS gas and an ozone-oxygen gas are separately introduced into the reaction chamber by using a group of nozzles for injecting TEOS gas and another group of nozzles for injecting the ozone-oxygen gas such that the two gases mix with each other just in the vicinity of the substrate surface. Naturally this method is free from the above described disadvantages of the premix method.

However, by the post-mix method it is difficult to deposit a silicon oxide film that has very good film properties and conformality to underlying steps, because TEOS is allowed to react with ozone only for a very short period of time. To improve the film properties it is necessary to greatly increase the ozone concentration, but various problems arise when a very high ozone concentration is employed.

SUMMARY OF THE INVENTION

It is an object of the present invention to provide an improved CVD method by which a silicon oxide film of very good properties can be deposited without suffering from the disadvantages inherent to the conventional premix method and without using ozone in high concentrations.

In principle, the invention is a method of depositing a film on a substrate surface by CVD, comprising the steps of heating a substrate in a reaction chamber, outside the reaction chamber preparing a gas mixture of a first reactant gas and a second reactant gas which reacts relatively mildly with the first reactant gas and feeding the gas mixture into the reaction chamber, and feeding a third reactant gas, which reacts with the first reactant gas more vigorously than the second reactant gas, directly into the reaction chamber such that the third reactant gas comes into contact with and mixes with the aforementioned gas mixture in the vicinity of the substrate surface.

A preferred embodiment of the invention is a CVD method using TEOS gas, or an alternative organosilicon compound gas, and ozone to deposit a silicon oxide film. In this embodiment, a gas mixture of TEOS gas and a first oxygen gas containing ozone is prepared outside a reaction chamber in which a substrate is heated, and the gas mixture is fed into the reaction chamber. Separately a second oxygen gas, which contains ozone and is higher in ozone concentration than the first oxygen gas, is directly fed into the reaction chamber. It is suitable that the ozone concentration in the first oxygen gas is in the range from 0.1 to 1% by volume, whereas the ozone concentration in the second oxygen gas is in the range from 1 to 10%.

In the preferred embodiment of the invention a mixture of TEOS gas and an oxygen gas containing ozone in a low concentration is fed into the reaction chamber while TEOS gas is mildly reacting with ozone. Therefore, TEOS reacts with ozone for a fairly long period of time to efficiently form intermediate reaction products which are effective for enhancing the properties of the deposited silicon oxide film and, when the substrate surface has steps, improving the step coverage and conformality of the deposited film. Because of low ozone concentration in the oxygen gas mixed with TEOS gas, there is little possibility of depositing oxides in the piping for feeding the mixed gas into the reaction chamber or the gas injection nozzles in the reaction chamber. In the vicinity of the substrate surface the mildly reacting gas mixture comes into contact with the second oxygen gas containing ozone in a higher concentration to result in very efficient oxidation of already decomposing TEOS and consequential deposition of a silicon oxide film with very good properties and low moisture content. The CVD apparatus can be operated for very long hours without suffering from deterioration of the gas feeding piping and gas injection nozzles, changes in the film deposition rate and film properties or an increase in the adhesion of contaminating particles to the deposited film.

DESCRIPTION OF THE PREFERRED EMBODIMENTS

EXAMPLE 1

This example relates to the deposition of a silicon oxide film by using TEOS and ozone as essential reactants.

Figure 1:
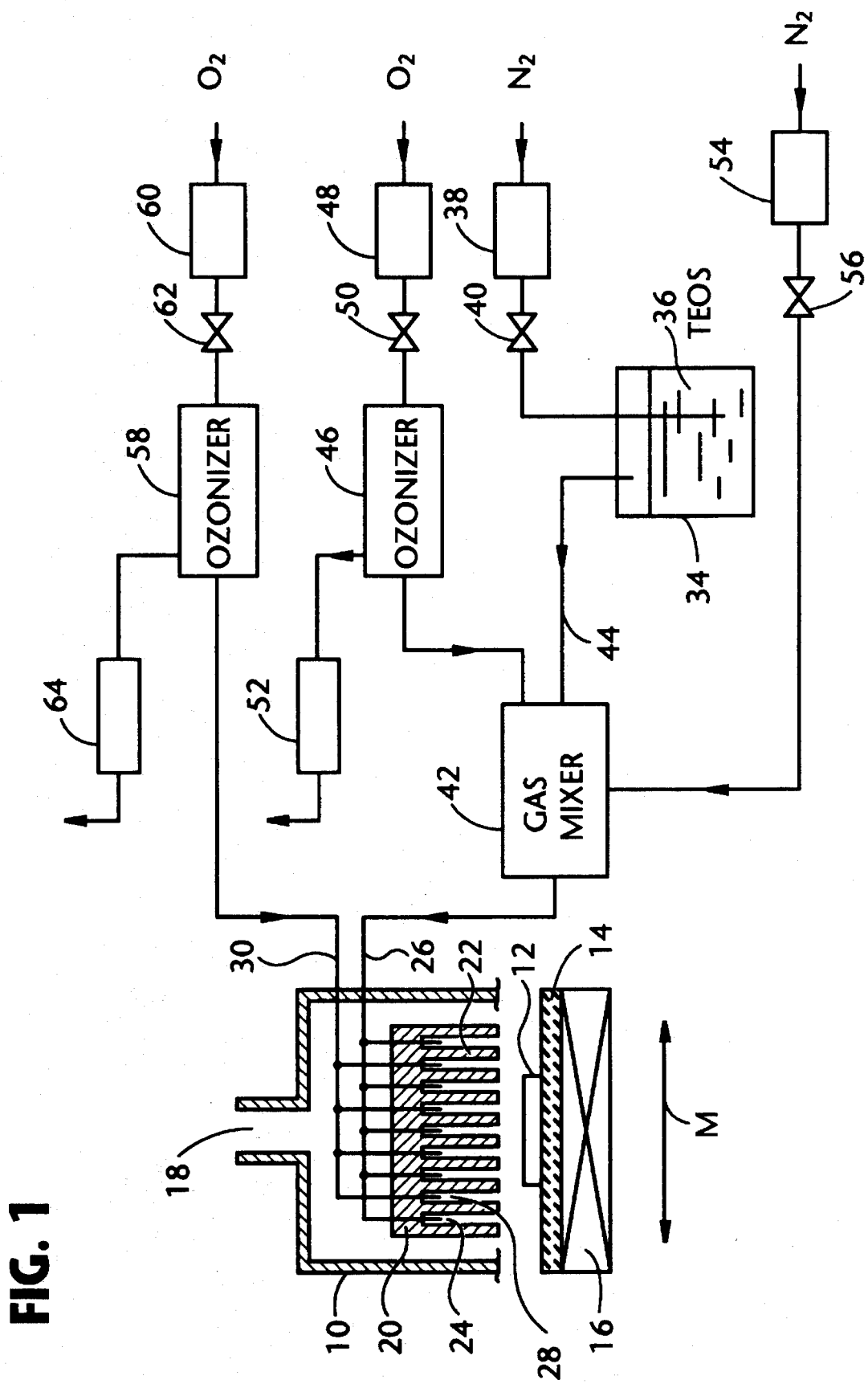
FIG. 1 is a diagrammatic illustration of a CVD apparatus used in a first example of the invention.

FIG. 1 shows the outline of an atmospheric pressure CVD apparatus used in this example. The apparatus has a conventional reaction chamber 10 (only partly illustrated) in which a substrate 12 is placed on a susceptor 14 made of silicon carbide. A heater module 16 is provided so as to heat the substrate 12 together with the susceptor 14. Opposite to the substrate surface there is a nozzle head 20 which has a number of gas dispersion plates 22 in parallel arrangement with narrow spacings, and between the dispersion plates 22 a first group of gas injecting nozzles 24 and a second group of gas injecting nozzles are alternately arranged so as to inject gases toward the substrate 12. The first group of nozzles 24 are connected to a first gas feed line 26 and the second group of nozzles 28 to a second gas feed line 30. The dispersion plates 22 and the nozzoles 24, 28 are arranged such that a gas injected from the first group of nozzles 24 and another gas injected from the second group of nozzles 28 mix with each other just in the vicinity of the substrate surface. The reaction chamber 10 has an exhaust port 18. As indicated by arrow M, during a CVD operation the susceptor 14 holding the substrate 12 can be reciprocated in a plane parallel to the substrate surface.

A mixture of TEOS gas and a first oxygen gas containing ozone is supplied to the first group of nozzles 24. In a thermostatic vessel 34, TEOS gas is prepared by evaporating liquid TEOS 36 by heating at about 60° C. and by bubbling with nitrogen gas which is introduced into the vessel 34 through a mass flow controller 38 and a valve 40. The evolved TEOS gas is passed to a gas mixer 42 through a pipe 44 which is kept suitably heated. Since the flow rate of TEOS gas depends on the temperature of liquid TEOS 36 besides the flow rate of nitrogen gas for bubbling, the liquid temperature in the vessel 34 is precisely controlled by PID (proportional, integral and differential) feedback control. Oxygen gas is supplied to a first ozonizer 46 of the silent discharge type through a mass flow controller 48 and a valve 50. The ozonizer 46 is operated so as ozonize a predetermined fraction of the supplied oxygen gas. To accurately control the degree of ozonization, the ozone concentration in the prepared ozone-oxygen gas is monitored with an ozone concentration analyzer 52. The ozone-oxygen gas is passed to the gas mixer 42. As a diluent gas, nitrogen gas is introduced into the gas mixer 42 through a mass flow controller 54 and a valve 56. The gas mixer 42 is kept heated so as to allow TEOS gas and ozone to begin mild reaction within the mixer 42 to form some intermediate reaction products. The mixed gas containing the intermediate reaction products is supplied to the first group of nozzles 24 through the first gas feed line 26 which is kept suitably heated.

There is a second ozonizer 58 to which oxygen gas is supplied through a mass flow controller 60 and a valve 62. The ozonizer 58 is operated so as to ozonize a predetermined fraction of supplied oxygen, and the operation is accurately controlled by using an ozone concentration analyzer 64. From this ozonizer 58 an ozone-oxygen gas is supplied to the second group of nozzles 28 through the second gas feed line 30.

In this example: the substrate temperature was 400° C.; flow rate of nitrogen gas for bubbling liquid TEOS was 1 slm; flow rate of the first ozone-oxygen gas from the first ozonizer 46 was 2 slm, and the ozone concentration in this ozone-oxygen gas was 0.5%; flow rate of the second ozone-oxygen gas from the second ozonizer 58 was 10 slm, and the ozone concentration in this ozone-oxygen gas was varied in the range from 1 to 5%; and flow rate of nitrogen gas directly supplied as diluent into the gas mixer 42 was 5 to 10 slm. The substrate surface was formed with steps, viz. aluminum wiring lines.

For comparison, fundamentally similar CVD operations were performed by conventional premix and post-mix methods using TEOS gas and an ozone-oxygen gas in both cases. In the premix method the two gases were mixed together before feeding into the reaction chamber. In the post-mix method the two gases were separately fed into the reaction chamber and allowed to mix together in the vicinity of the substrate.

Figure 2:
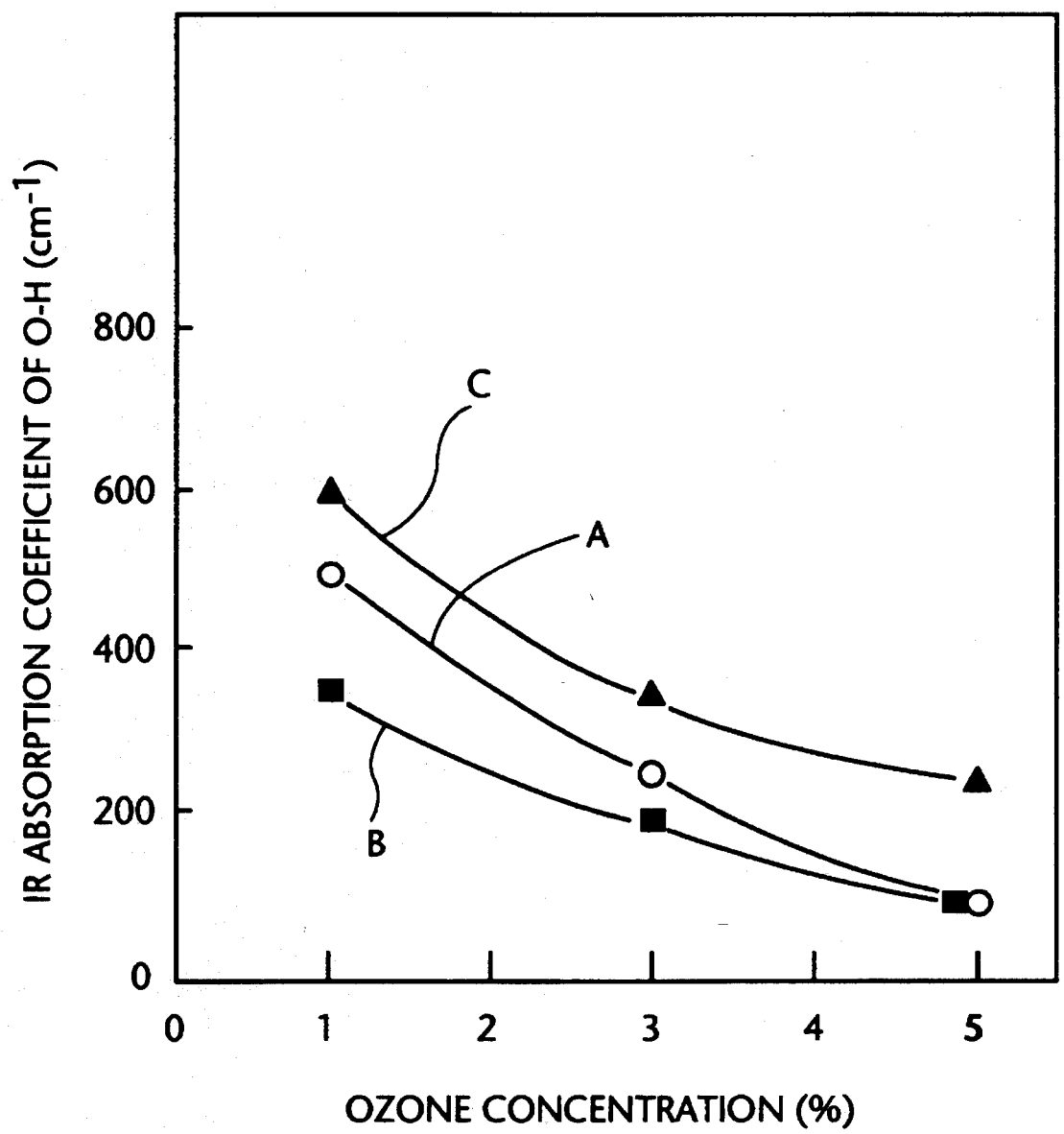
FIG. 2 is a graph showing the dependence of the IR absorption coefficient of O—H group in a silicon oxide film deposited in the first example on the concentration of ozone in an oxygen gas used in the CVD operation.

On each of silicon oxide films deposited in Example 1 and the above described comparative experiments, an infrared absorption coefficient of O—H bond in the film was determined from the height of an absorption peak of O—H at about 3400 cm$^{-1}$ in IR absorption specra obtained with a FT-IR analyzer. The IR absorption coefficient of O—H bond is representative of and proportional to the moisture content in the film. The results are shown in FIG. 2, wherein the curve A represents Example 1, curve B the conventional premix mehthod and curve C the post-mix method. Ozone concentration on the abscissa refers to the ozone concentration in the ozone-oxygen gas supplied from the second ozonizer 58 in Example 1 or in the ozone-oxygen gas used in the premix and post-mix methods. It is seen that by comparison with a film deposited by the post-mix method a film deposited in Example 1 is always lower in moisture content, and that by comparison with a film deposited by the premix method a film obtained in Example 1 is higher in moisture content when the employed ozone concentration is relatively low but becomes almost equivalently low in moisture content when the ozone concentration is increased up to about 5%.

Figure 3:
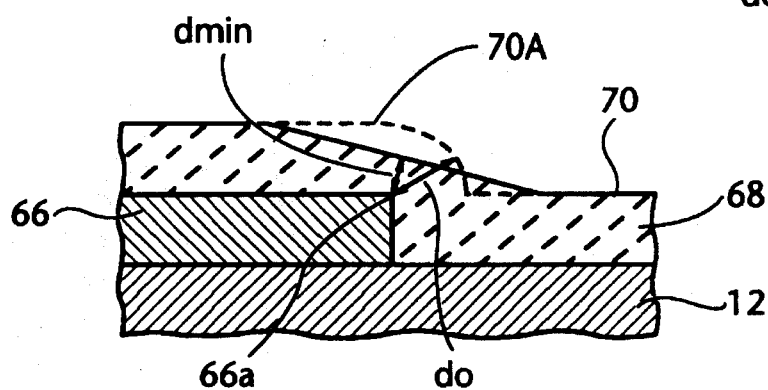
FIG. 3 is a fragmentary and elevational sectional view of a silicon oxide film deposited on a substrate having a step and illustrates the definition of a conformality index of the film.

Next, step coverage of the silicon oxide films deposited on the aluminum steps on the substrate surface was evaluated by measuring a conformality index from SEM photographs of elevational sections of each film. FIG. 3 illustrates the definition of the conformality index, D, which is described in IEDM-89 (1989), pp. 669–672. In FIG. 3 a silicon oxide film 68 is formed on a substrate 12 having a step (aluminum line) 66 on the surface. The film 68 has a surface 70 which is sloping over an edge 66a of the step 66. Arrow $d_{min}$ indicates the length of a perpendicular drawn from the edge 66a of the step 66 to the film surface 70. That is, $d_{min}$ is the minimum distance of the film surface 70 from the edge 66a. If the film 68 is accurately conformal to the step 66, i.e. if step coverage of the film is 100%, the film will have a suppositional surface indicated at 70A by broken line. In an area over the edge 66a of the step 66 the sectional profile of the suppositional surface 70A coincides with an arc with center at the edge 66a, and therefore the minimum distance $d_0$ of the suppositional surface 70A from the edge 66a is the radius of the arc. The conformality index D is defined as: $D=(1-d_{min}/d_0)\times 100$ (%). Therefore, a large value of D means good step coverage.

Figure 4:
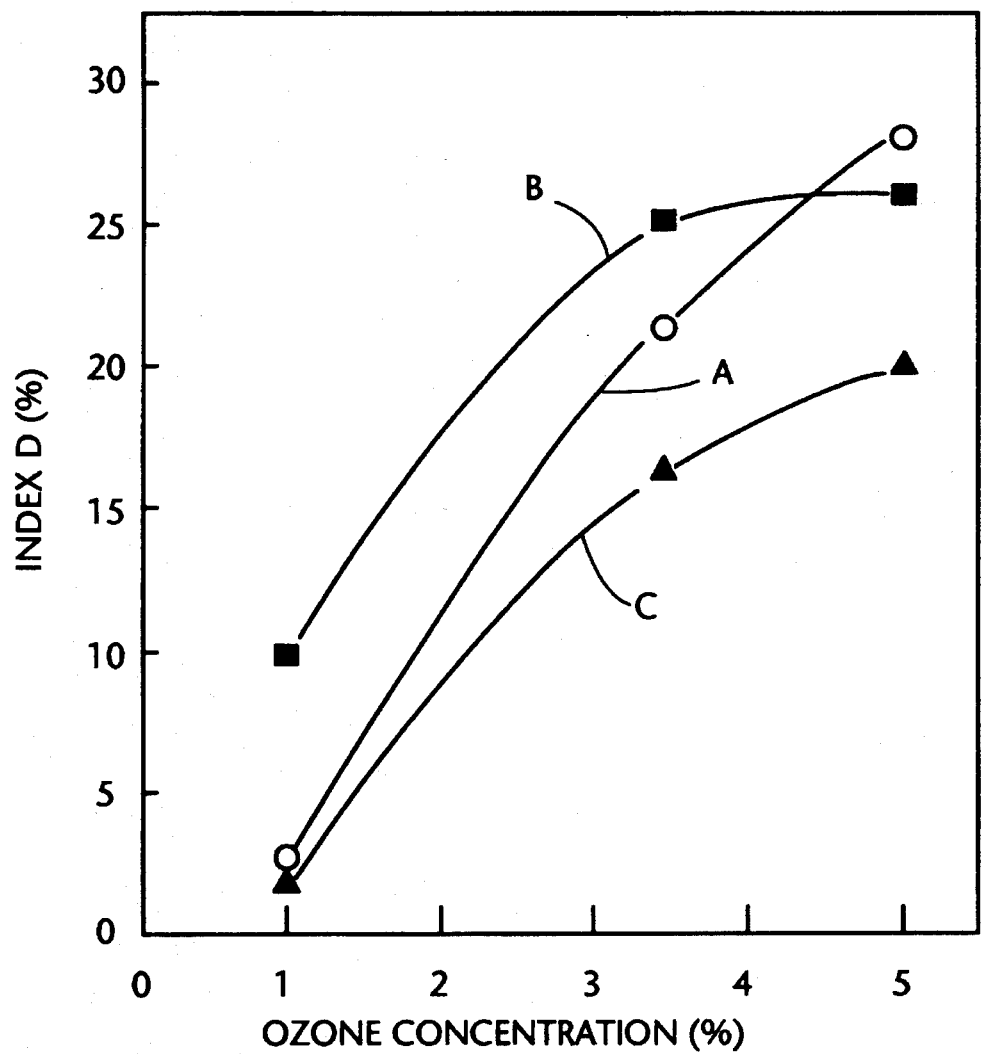
FIG. 4 is a graph showing the dependence of the conformality index of silicon oxide films deposited in the first example on the concentration of ozone in an oxygen gas used in the CVD operation.
Figure 5:
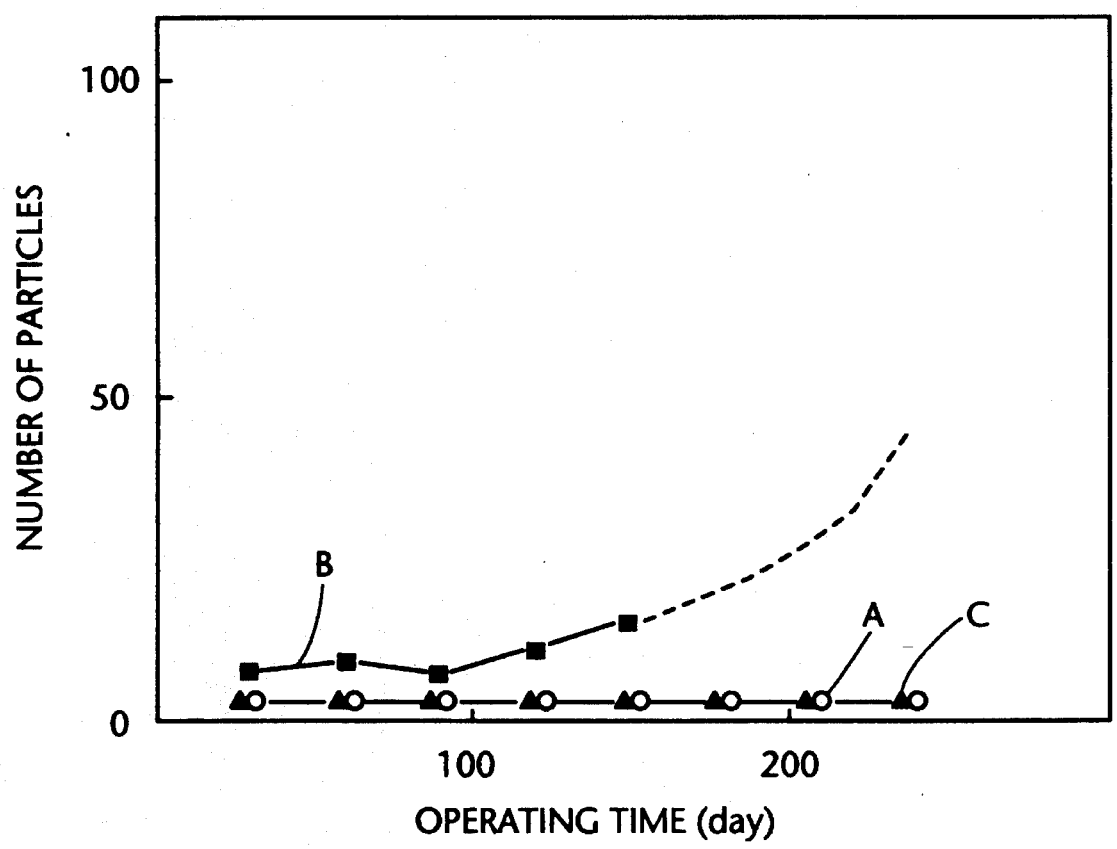
FIG. 5 is a graph showing the relationship between the operating hours of the CVD apparatus used in the first example and the number of particles on the obtained silicon oxide film.

The results are shown in FIG. 4, wherein the curve A represents Example 1, curve B the premix method and curve C the post-mix method. Ozone concentration on the abscissa is in the same sense as in FIG. 2. It is seen that when the ozone concentration is 5% a film deposited in Example 1 is comparable to, or even better than, a film deposited by the premix method in the value of the index D. That is, by the method of Example 1 a silicon film of good step coverage can be obtained by directly introducing an ozone-oxygen gas containing at least 5% of ozone into the reaction chamber.

In Example 1 and the comparative experiments by the premix and post-mix methods the ozone concentration was kept constant at 5%, and each CVD apparatus was operated for many days to deposit silicon oxide films on 8-inch silicon wafers (substrates 12), and the number of contaminating particles on each film was measured at predetermined time intervals. The results are shown, wherein the curve A represents Example 1, curve B the premix method and curve C the post-mix method. It is seen that there is little difference between the method of Example 1 and the post-mix method in respect of smallness of the number of particles. As to the premix method, the number of particles was relatively large even at the initial stage of long operation and significantly increased as the apparatus was operated for more than 100 days. By observation after operating for 150 days, deposition of a small quantity of silicon oxide powder was found in the gas injection nozzles of the apparatus. In the apparatus of Example 1 every nozzle was free from such a powder.

The above experimental results have evidenced that in the method of Example 1 it is favorable to supply an ozone-oxygen gas containing only about 0.5% of ozone to the gas mixer 42 and another ozone-oxygen gas containing only about 5% of ozone directly into the reaction chamber 10. When the ozone concentrations are so chosen, the obtained silicon oxide film is very good in film properties and step coverage and equivalent in these respects to a film obtained by the conventional premix method employing 5% ozone concentration, and the former film has an advantage that the number of contaminating particles is smaller than on the film by the premix method and comparble to the product of the post-mix method.

In Example 1 TEOS is used as the silicon source, but this is not limitative. For example, alternatively useful organo-silicon compounds are alkyl- or alkoxylsilanes such as diethylsilane $SiH_2(C_2H_5)_2$, tetramethylsilane $Si(CH_3)_4$ and triethoxysilane $SiH(OC_2H_5)_3$, linear siloxanes represented by hexamethyldisiloxane $(CH_3)_3SiOSi(CH_3)_3$ and cyclic siloxanes represented by tetramethylcyclotetrasiloxane $Si_4O_4H(CH_3)_4$.

EXAMPLE 2

In this example, triethoxyfluorosilane (abbreviated to TEFS) $SiF(OC_2H_5)_3$ is used in place of the second ozone-oxygen gas (1–5% ozone) in Example 1 with a view to further decreasing the moisture content in the deposited silicon oxide film.

Figure 6:
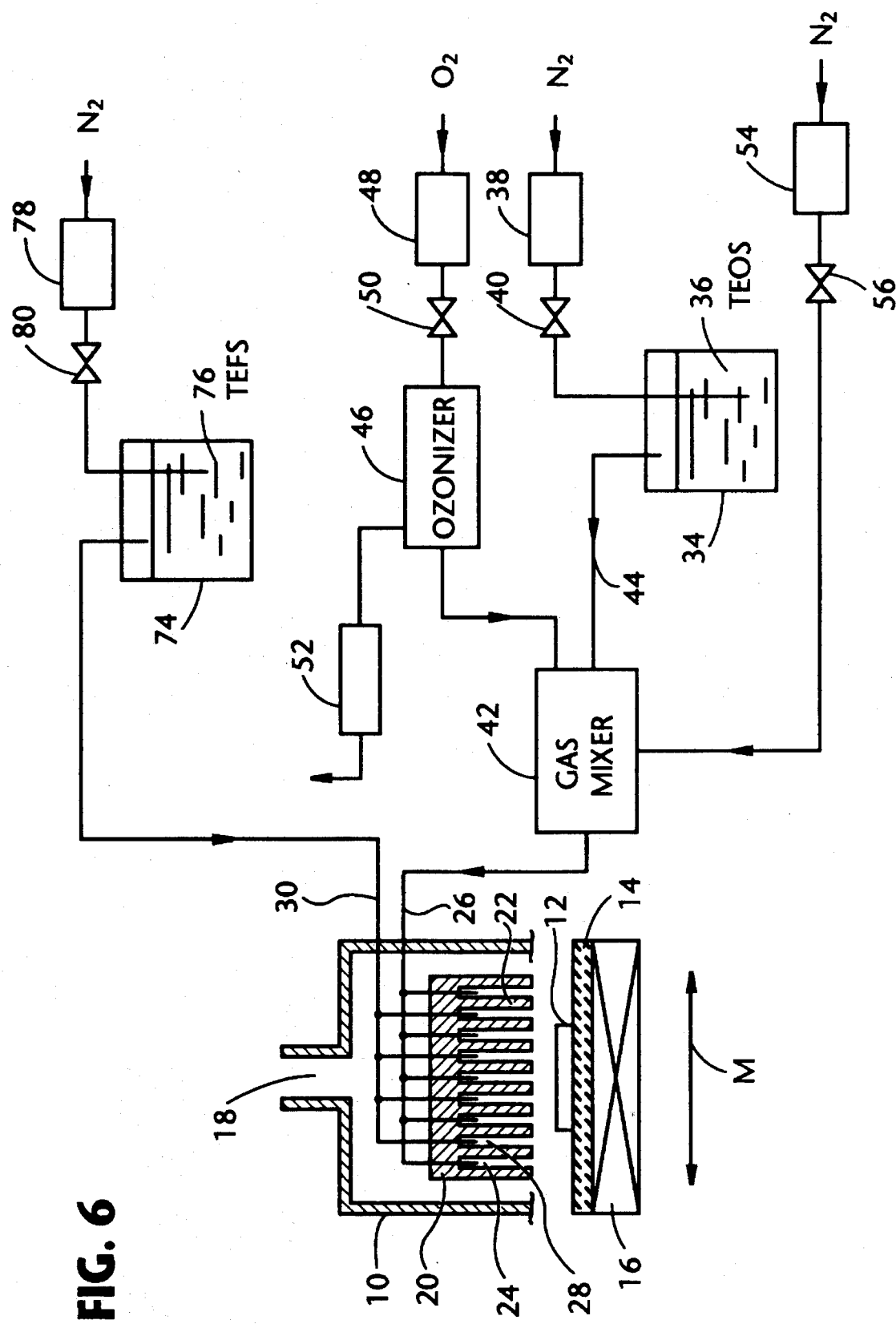
FIG. 6 is a diagrammatic illustration of a CVD apparatus used in a second example of the invention.

FIG. 6 shows the outline of the CVD apparatus used in this example. In this apparatus the reaction chamber 10, TEOS evaporator 34, ozonizer 46 and gas mixer 42 are as described in Example 1 with reference to FIG. 1. Since TEFS is liquid at room temperature, TEFS gas is prepared in a thermostatic vessel 74 by heating liquid TEFS 76 under bubbling with nitrogen gas supplied through a mass flow controller 78 and a valve 80. The liquid TEFS 76 is kept at a relatively low temperature of 40° C. since the vapor pressure of TEFS is about twice that of TEOS. The evolved TEFS gas is supplied to the second group of nozzles 28 through the second gas feed line 30 which is kept suitably heated. Since the flow rate of TEFS gas depends on the temperature of liquid TEFS 76 besides the flow rate of nitrogen gas for bubbling, the liquid temperature is precisely controlled by PID feedback control.

In the reaction chamber 10, TEFS gas is injected from the second group of nozzles 28 and mixes with the mixture of TEOS gas and ozone-oxygen gas injected from the first group of nozzles 24 just in the vicinity of the substrate surface.

In this example: the substrate temperature was 200° C.; flow rate of nitrogen gas for bubbling TEOS liquid was 1 slm, flow rate of ozone-oxygen gas from the ozonizer 46 was 2 slm, and ozone concentration in this gas was 1.0%; flow rate of nitrogen gas for bubbling TEFS liquid 76 was 0.1 to 1.0 slm; and flow rate of nitrogen gas directly supplied as diluent into the gas mixer 42 was 5 to 10 slm. As the result, a silicon oxide film of very good properties deposited on the substrate 12.

In Example 2, the quantity of fluorine remaining in the deposited silicon oxide film is roughly proportional to the flow rate of TEFS gas. If a silicon oxide film is deposited by using TEFS as the sole silicon source gas, the fluorine content in the film reaches about 10%. In this example, when the flow rate of nitrogen gas for bubbling liquid TEFS was 0.1 slm the fluorine content in the obtained silicon oxide film was only about 0.1%.

For comparison, conventional premix and post-mix methods were alternately employed for the deposition of a silicon oxide film by CVD using TEOS, ozone and TEFS as reactants.

Figure 7:
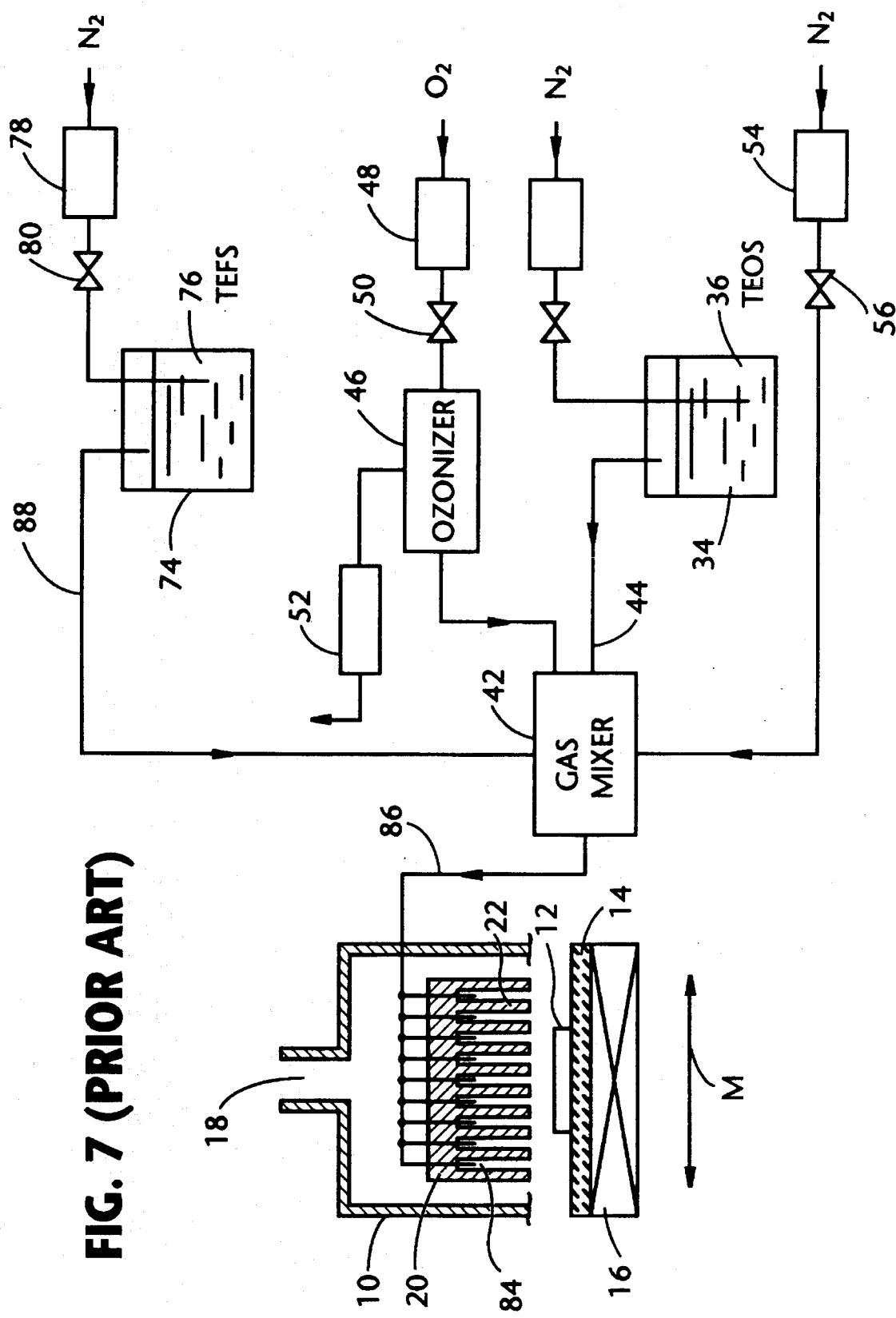
FIGS. 7 and 8 are diagrammatic illustrations of two conventional CVD apparatus, respectively, used for comparison with the second example of the invention.

FIG. 7 shows the apparatus used in the premix method. This apparatus differs from the apparatus of Example 2 (FIG. 6) only in the following respects. In the reaction chamber 10 the nozzle head 20 has only one set of nozzles 84 which are connected to the gas mixer 42 by a gas feed line 86. TEFS gas evolved in the vessel 74 is introduced into the gas mixer 42 through pipe 88 which is kept suitably heated. Therefore, TEOS gas, ozone-oxygen gas and TEFS gas are all mixed together in the gas mixer 42, and the resultant gas mixture is supplied to every nozzle 84 in the reaction chamber 10. A silicon oxide film of good properties was obtained by the CVD operation with the apparatus of FIG. 7. However, as the operation was repeated a white powder deposited and accumulated on the inner wall surfaces of the gas feed pipe 86 and nozzles 84 by reason that TEOS, ozone and TEFS rapidly reacted within the gas mixer 42 to form some silicon oxide. In Example 2, the pipes 26, 30 and the nozzles 24, 28 remained clean since TEFS did not make contact with TEOS and ozone before injection from the nozzles 28.

Figure 8:
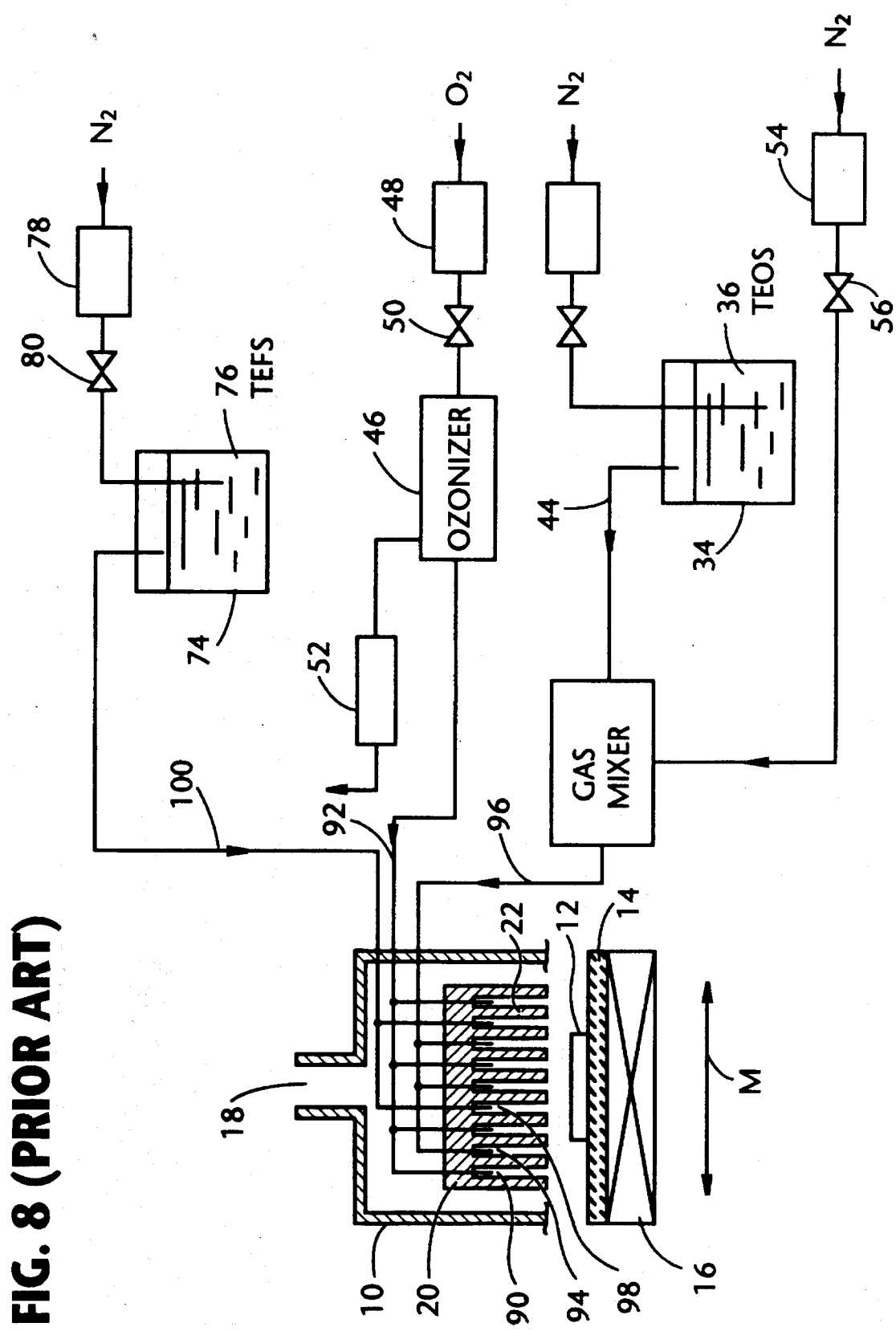

FIG. 8 shows a CVD apparatus used in the post-mix method. This apparatus differs from the apparatus used in Example 2 (FIG. 6) only in the following respects. In the reaction chamber 10 the nozzle head 20 has three groups of nozzles, viz. first group of nozzles 90 which are connected to the ozonizer 46 by a first gas feed line 92, a second group of nozzles 94 which are connected to the gas mixer 42 by a second gas feed line 96 and a third group of nozzles 98 to which TEFS gas is supplied through a third gas feed line 100. The ozonizer 46 is not connected to the gas mixer 42, so that only TEOS gas and nitrogen gas are mixed in the gas mixer 42. Thus, TEOS gas, ozone-oxygen gas and TEFS gas are all separately introduced into the reaction chamber 10 so as to mix together just in the vicinity of the substrate surface.

In the CVD operation with the apparatus of FIG. 8, the substrate temperature was 200° C. and the ozone concentration in the ozone-oxygen gas was 1% in conformity with Example 2. In this case the obtained silicon oxide film was not very good in film properties and contained considerable moisture despite the use of TEFS.

In Example 2, TEOS begins to mildly react with ozone within the gas mixer 42 or the gas feed pipe 26 to form intermediate reaction products. Therefore, when the gas mixture injected from the nozzles 24 comes into contact with TEFS gas injected from the nozzles 28 on or in the vicinity of the substrate surface, TEFS molecules readily and rapidly react with the intermediate reaction products contained in the TEOS-ozone mixed gas. As a result of the rapid reaction of TEFS molecules, fluorine atom contained in TEFS can serve the purpose of preventing the formation of Si—O—H bond in the silicon oxide film deposited by the reactions on the substrate surface. In consequence the moisture content in the silicon oxide film becomes very low. In fact, when the flow rate of TEFS gas in Example 2 was 0.1 slm, the moisture content in the obtained film was only about ½ of that in the film obtained by the post-mix method with the apparatus of FIG. 8. For a reduction in the moisture content it is effective to use an ozone-oxygen gas containing not less than 0.5% of ozone, though a very high concentration of ozone is undesirable because of excessively rapid reaction between TEOS and ozone in the gas mixer 42.

In place of the ozone-oxygen gas supplied to the gas mixer 42 in Examples 1 and 2, it is possible to use gas or vapor of a different compound reactive with TEOS, such as vapor of hydrogen oxide (water) $H_2O$ or hydrogen peroxide $H_2O_2$. In place of TEFS gas used in Example 2, it is possible to use a different halogen compound gas such as silicon tetrafluoride $SiF_4$ or silicon tetrachloride $SiCl_4$.

Both Examples 1 and 2 relate to atmospheric pressure CVD. However, also it is possible to apply the present invention to reduced pressure CVD, high pressure CVD or plasma-enhanced CVD.

What is claimed is:

1. A method of forming a silicon oxide film on a substrate surface by chemical vapor deposition, comprising the steps of:

heating a substrate in a reaction chamber;

outside the reaction chamber preparing a gas mixture of an organosilicon compound gas and a first oxygen gas containing ozone, the first oxygen gas having an ozone concentration in the range from 0.1 to 1% by volume, and feeding the gas mixture into the reaction chamber; and feeding a second oxygen gas containing ozone, the second oxygen gas having an ozone concentration in the range from 1 to 10% by volume and being higher in ozone concentration than said first oxygen gas, directly into the reaction chamber such that the second oxygen gas comes into contact with and mixes with said gas mixture in the vicinity of the substrate surface.

2. A method according to claim 1, wherein said organosilicon compound is tetraethylorthosilicate.

3. A method according to claim 1, wherein said organosilicon compound is selected from the group consisting of diethylsilane, tetramethylsilane, triethyoxysilane, hexamethyldisiloxane and tetramethylcyclotetrasiloxane.

4. A method of forming a silicon oxide film on a substrate surface by chemical vapor deposition, comprising the steps of:

heating a substrate in a reaction chamber;

feeding a gas mixture of a first reactant gas comprising an organosilicon compound gas and a second reactant gas which is an oxygen gas containing ozone and which reacts relatively mildly with the organosilicon compound gas into the reaction chamber; and feeding a third reactant gas which is a gas comprising a halogen-containing silicon compound and which reacts with said organosilicon compound gas more vigorously than said second reactant gas, directly into the reaction chamber such that the third reactant gas comes into contact with and mixes with said gas mixture in the vicinity of the substrate surface, wherein said halogen-containing silicon compound is selected from the group consisting of triethoxyfluorosilane, silicon tetrafluoride and silicon tetrachloride.

5. A method according to claim 4, wherein said organosilicon compound is selected from the group consisting of tetraethylorthosilicate, diethylsilane, tetramethylsilane, triethyoxysilane, hexamethyldisiloxane and tetramethylcyclotetrasiloxane.

6. A method of forming a silicon oxide film on a substrate surface by chemical vapor deposition, comprising the steps of:

heating a substrate in a reaction chamber;

feeding into the reaction chamber a gas mixture of a first reactant gas comprising an organosilicon compound gas and a second reactant gas selected from the group consisting of water vapor and hydrogen peroxide vapor and which reacts relatively mildly with the organosilicon compound gas; and feeding a third reactant gas which is an oxygen gas containing ozone and which reacts with said organosilicon compound gas more vigorously than said second reactant gas, directly into the reaction chamber such that the third reactant gas comes into contact with and mixes with said gas mixture in the vicinity of the substrate surface.

7. A method according to claim 6, wherein said organosilicon compound is selected from the group consisting of tetraethylorthosilicate, diethylsilane, tetramethylsilane, triethyoxysilane , hexamethyldisiloxane and tetramethylcyclotetrasiloxane.

8. A method of forming a silicon oxide film on a substrate surface by chemical vapor deposition, comprising the steps of:

heating a substrate in a reaction chamber;

feeding into the reaction chamber a gas mixture of a first reactant gas comprising an organosilicon compound gas and a second reactant gas selected from the group consisting of water vapor and hydrogen peroxide vapor and which reacts relatively mildly with the organosilicon compound gas; and feeding a third reactant gas which is a gas comprising a halogen-containing silicon compound selected from the group consisting of triethoxyfluorosilane, silicon tetrafluoride and silicon tetrachloride and which reacts with said organosilicon compound gas more vigorously than said second reactant gas, directly into the reaction chamber such that the third reactant gas comes into contact with and mixes with said gas mixture in the vicinity of the substrate surface.

9. A method according to claim 8, wherein said organosilicon compound is selected from the group consisting of tetraethylorthosilicate, diethylsilane, tetramethylsilane, triethoxysilane, hexamethyldisiloxane and tetramethylcyclotetrasiloxane.

* * * * *